(12) United States Patent
Gwinn et al.

(10) Patent No.: US 9,343,259 B2
(45) Date of Patent: May 17, 2016

(54) GCIB NOZZLE ASSEMBLY

(71) Applicant: TEL Epion Inc., Billerica, MA (US)

(72) Inventors: Matthew C. Gwinn, Winchendon, MA (US); Avrum Freytsis, Salem, MA (US); Robert K. Becker, Danvers, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/815,265

(22) Filed: Jul. 31, 2015

(65) Prior Publication Data
US 2016/0042909 A1 Feb. 11, 2016

Related U.S. Application Data

(60) Provisional application No. 62/033,253, filed on Aug. 5, 2014.

(51) Int. Cl.
*H01J 37/08* (2006.01)
*H01J 37/305* (2006.01)

(52) U.S. Cl.
CPC .............. *H01J 37/08* (2013.01); *H01J 37/305* (2013.01); *H01J 2237/061* (2013.01); *H01J 2237/0812* (2013.01)

(58) Field of Classification Search
USPC .................................. 250/492.21, 423 R, 251
See application file for complete search history.

(56) References Cited

U.S. PATENT DOCUMENTS

| 8,993,982 | B2 * | 3/2015 | Barnard | H01J 37/08 118/723 CB |
| 2010/0243913 | A1 * | 9/2010 | Becker | H01J 37/08 250/423 R |
| 2011/0155897 | A1 * | 6/2011 | Harrison | H01J 37/08 250/251 |

* cited by examiner

*Primary Examiner* — Kiet T Nguyen

(57) ABSTRACT

A nozzle assembly used for performing gas cluster ion beam (GCIB) etch processing of various materials is described. In particular, the nozzle assembly includes two or more conical nozzles that are aligned such that they are both used to generate the same GCIB. The first conical nozzle may include the throat that initially forms the GCIB and the second nozzle may form a larger conical cavity that may be appended to the first conical nozzle. A transition region may be disposed between the two conical nozzles that may substantially cylindrical and slightly larger than the largest diameter of the first conical nozzle.

20 Claims, 6 Drawing Sheets

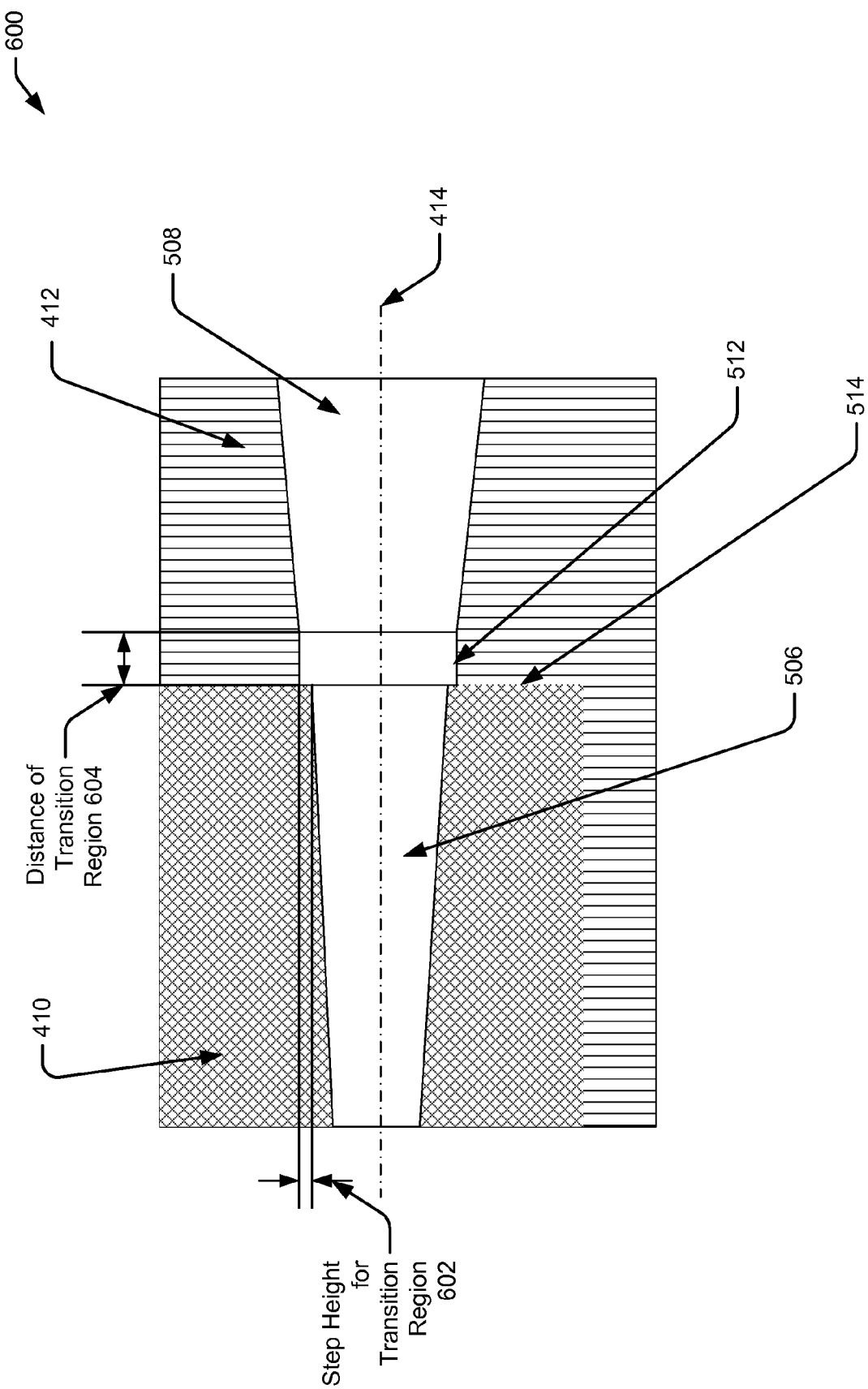

GCIB NOZZLE ASSEMBLY

CROSS REFERENCE TO RELATED APPLICATION

Pursuant to 37 C.F.R. §1.78(a)(4), this application claims the benefit of and priority to prior filed Provisional Application Ser. No. 62/033,253 filed Aug. 5, 2014, which is expressly incorporated herein by reference.

FIELD OF USE

The invention relates to a system and method for treating a substrate using a gas cluster ion beam (GCIB), and more particularly to an improved beam source and associated improved GCIB for processing on a substrate.

BACKGROUND

The use of a gas cluster ion beam (GCIB) for etching, cleaning, and smoothing surfaces is known (see for example, U.S. Pat. No. 5,814,194, Deguchi, et al.). GCIBs have also been employed for assisting the deposition of films from vaporized carbonaceous materials (see for example, U.S. Pat. No. 6,416,820, Yamada, et al.)

For purposes of this discussion, gas clusters may be nano-sized aggregates of materials that are gaseous under conditions of standard temperature and pressure. Such gas clusters may comprise of aggregates including a few to several thousand molecules, or more, that are loosely bound together. The gas clusters may be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the workpiece. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Conventional cluster ion sources produce cluster ions having a wide size distribution scaling with the number of molecules in each cluster that may reach several thousand molecules. Clusters of atoms can be formed by the condensation of individual gas atoms (or molecules) during the adiabatic expansion of high-pressure gas from a nozzle into a vacuum. A skimmer with a small aperture strips divergent streams from the core of this expanding gas flow to produce a collimated beam of clusters. Neutral clusters of various sizes are produced and held together by weak inter-atomic forces known as Van der Waals forces. This method has been used to produce beams of clusters from a variety of gases, such as helium, neon, argon, krypton, xenon, nitrogen, oxygen, carbon dioxide, sulfur hexafluoride, nitric oxide, nitrous oxide, and mixtures of these gases. Thus, there exists a need to provide methods and apparatus for improving the beam stability in high current GCIB workpiece processing systems.

SUMMARY

Described herein is a nozzle/skimmer module and an improved gas cluster ion beam (GCIB) system for treating a substrate using a GCIB.

The nozzle/skimmer module may include an internal nozzle element and internal skimmer cartridge assembly to control the formation of the GCIB. The nozzle/skimmer module can be pre-aligned to position the GCIB relative to the substrate. The nozzle/skimmer module may include a nozzle assembly and a skimmer assembly to control the formation of the gas clusters of the GCIB.

According to another embodiment, an improved GCIB processing system is provided that comprises a source subsystem that includes a nozzle/skimmer module, an ionization/acceleration subsystem, and a processing subsystem. The source subsystem can include a source chamber having an interior space in which the nozzle/skimmer module is configured, the ionization/acceleration subsystem can include an ionization/acceleration chamber, and the processing subsystem can include a processing chamber. The improved GCIB processing system comprises a first gas supply subsystem, a second process gas supply subsystem, and a first pumping subsystem coupled to the nozzle/skimmer module.

BRIEF DESCRIPTION OF THE DRAWINGS

The present invention is illustrated by way of example and not as a limitation in the figures of the accompanying drawings, in which:

FIG. 6 includes a cross-section illustration of a transition region between two nozzles in the nozzle component for the GCIB processing system.

DETAILED DESCRIPTION

Figure 1:
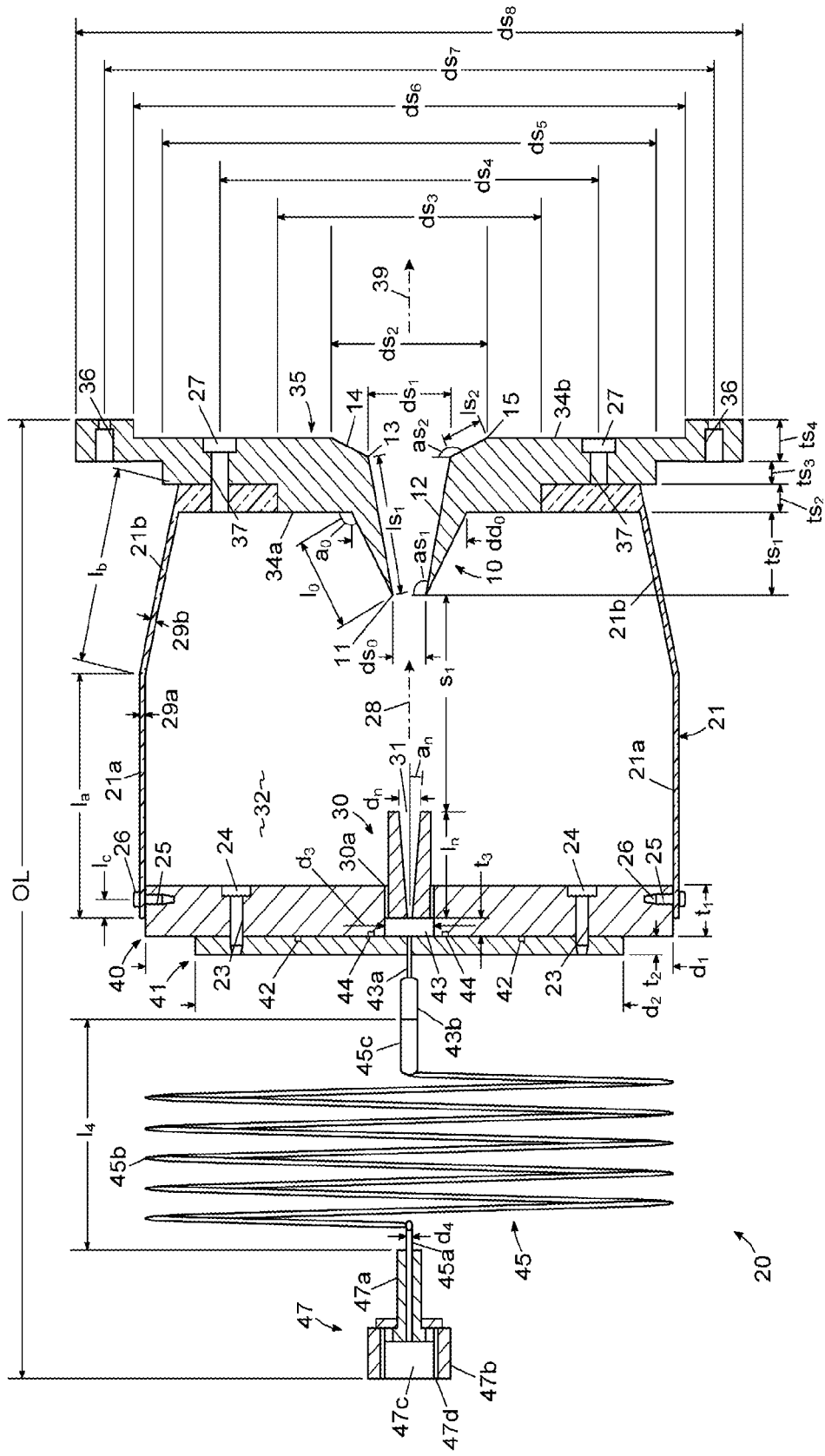
FIG. 1 illustrates a simplified block diagram of an exemplary nozzle/skimmer module in accordance with embodiments of the invention.

The object set forth above as well as further and other objects and advantages of the present invention are achieved by the embodiments of the invention described herein below.

Means for creation of and acceleration of such GCIBs are described in the reference (U.S. Pat. No. 5,814,194) previously cited, the teachings of which are incorporated herein by reference. Presently available ion cluster sources produce clusters ions having a wide distribution of sizes, N, up to N of several thousand (where N=the number of molecules in each cluster—in the case of monatomic gases like argon, an atom of the monatomic gas will be referred to as either an atom or a molecule and an ionized atom of such a monatomic gas will be referred to as either an ionized atom, or a molecular ion, or simply a monomer ion—throughout this discussion).

In efforts to achieve stable high current GCIBs for workpiece processing in a GCIB processing system, developments in GCIB ionization sources, management of beam space charge, and management of workpiece charging have all been important areas of development. U.S. Pat. No. 6,629,508 to Dykstra; U.S. Pat. No. 6,646,277 to Mack et al.; and copending U.S. patent application Ser. No. 10/667,006, the contents of all of which are incorporated herein by reference as though set out at length herein, each describe advances in several of these areas that have resulted in the ability to produce GCIB beams of at least several hundreds of microamperes to one or more milliamperes of beam current. These beams, however, can exhibit, in some cases, instabilities that may limit their optimal use in industrial applications.

In a typical GCIB processing tool, the ionizer and the workpiece being processed are each typically contained in separate chambers. This provides for better control of system pressures. However, even with excellent vacuum system design and differential isolation of various regions of the apparatus, a major area of difficulty with beams carrying large amounts of gas is that pressures may increase throughout the beamline. The entire gas load of the beam is released when the GCIB strikes the target region, and some of this gas influences pressures throughout the GCIB processing system's vacuum chambers. Because high voltages are often used in the formation and acceleration of GCIBs, increased beamline pressures can result in arcing, discharges, and other beam instabilities. As beam currents are increased, gas transport by the beam increases and pressures throughout the beamline become more difficult to manage. Because of the unique ability, compared to a conventional ion beam, of a GCIB to transport and release large amounts of gas throughout the beamline, pressure related beam instabilities and electrical discharges are much more of a problem for high current GCIBs than for conventional ion beams. In a typical GCIB ion source, neutral gas clusters in a beam are ionized by electron bombardment. The ionizer region is generally a relatively poor vacuum region and is typically at a high electrical potential relative to surrounding structures.

In other embodiments, the GCIB system may be used to generate neutral beams in which the gas clusters may not be ionized. This gas cluster beam (GCB) may be used to remove residue or films from the substrate. In certain embodiments, the GCIB may have non-ionized clusters and the GCIB processes disclosed herein may be modified to increase the amount of non-ionized clusters to for the GCB.

The present invention uses a combination of a combined source in a nozzle/skimmer module, electronic positioning techniques, and isolation elements to create an improved GCIB and reduce the frequency of transients occurring in the GCIB system.

FIG. 1 illustrates a simplified block diagram of an exemplary nozzle/skimmer module in accordance with embodiments of the invention. In the illustrated embodiment, an exemplary nozzle/skimmer module 20 is shown that can operate as a pre-aligned GCIB source.

Designing a pre-aligned nozzle/skimmer module can reduce the alignment issues. The current design involves a fixed skimmer and adjustable nozzle, which can require readjustment after a vent cycle. Subtle changes can occur in beam shape/profile when the nozzle manipulator is adjusted in the current design. By pre-aligning the nozzle/skimmer module 20, adjustment issues can be reduced or possibly eliminated. By constructing the nozzle and the skimmer in fixed tandem configuration, the beam alignment can be simplified significantly. In addition, pre-aligning the nozzle/skimmer module 20 can decrease the maintenance time and increase overall beam stability. The pre-aligned nozzle/skimmer module can be aligned using a dedicated test stand that could use Schlieren optics to maximize efficient gas transport through the skimmer.

When the nozzle/skimmer module 20 is pre-aligned, it can be pre-aligned for a first gas composition, and the first gas composition can include a condensable inert gas that can include a noble gas, i.e., He, Ne, Ar, Kr, Xe, or Rn. In various examples, the nozzle/skimmer module 20 can be pre-aligned using other gas compositions that can comprise a film forming gas composition, an etching gas composition, a cleaning gas composition, a smoothing gas composition, etc. Furthermore, the nozzle/skimmer module 20 can be configured to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any combination of two or more thereof.

The nozzle/skimmer module 20 can be configured and pre-aligned to operate in a low-pressure environment and the operational pressures can range from approximately 0.01 mTorr to approximately 100 mTorr.

The nozzle/skimmer module 20 can be constructed using a nozzle assembly 30 for establishing an internal beam 28, a skimmer cartridge assembly 35 for establishing an external beam 39, a support tube 21, a first cylindrical subassembly 40, and a second cylindrical subassembly 41. The nozzle assembly 30, the skimmer cartridge assembly 35, the support tube 21, the first cylindrical subassembly 40, or the second cylindrical subassembly 41, or any combination thereof can be fabricated using stainless steel material. Alternatively, the nozzle assembly 30, the skimmer cartridge assembly 35, the support tube 21, the first cylindrical subassembly 40, or the second cylindrical subassembly 41, or any combination thereof can be fabricated using hardened and/or coated material.

A first portion 21a of the support tube 21 can be a substantially closed cylindrical subassembly having a first thickness 29a that can vary from approximately 0.5 mm to 5 mm. The second portion 21b of the support tube 21 can be a substantially open frustoconical assembly having a second thickness 29b that can vary from approximately 0.5 mm to 5 mm. The first portion 21a of the support tube 21 can be removably coupled to the first cylindrical subassembly 40 using two or more first mounting holes 25 and two or more first fastening devices 26, and the second portion 21b of the support tube 21 can be removably coupled to the skimmer cartridge assembly 35 using a plurality of second mounting holes 37 and second fastening devices 27. In some examples, the support tube 21 can enclose a partially-open process space 32, and a controlled low-pressure (vacuum) state can be established in the partially-open process space 32 when the nozzle/skimmer module 20 is being aligned tested and/or used.

The first portion 21a can have a first length ($l_a$) that can vary from approximately 30 mm to approximately 50 mm, and the first portion 21a can have a mounting length ($l_a$) that can vary from approximately 3 mm to approximately 5 mm. The second portion 21b can have a second length ($l_b$) that can vary from approximately 30 mm to approximately 50 mm.

The nozzle assembly 30 can be removably coupled to the second cylindrical subassembly 41. For example, the nozzle assembly 30 can be coupled to the second cylindrical subassembly 41 using a threaded means 30a. Alternatively, other attachment means may be used. The nozzle assembly 30 can have a nozzle length ($l_n$), a nozzle angle ($a_n$), and a nozzle output aperture 31 having a nozzle diameter ($d_n$). The nozzle length ($l_n$) (from the input to the nozzle output aperture 31) can vary from approximately 20 mm to approximately 40 mm; the nozzle angle ($a_n$) (from a centerline of the nozzle output aperture 31 to a an internal surface of the nozzle assembly 30) can vary from approximately 1 degree to approximately 30 degrees; and the nozzle diameter ($d_n$) can vary from approximately 2 mm to approximately 4 mm. The nozzle length ($l_n$), the nozzle angle ($a_n$), and the nozzle diameter ($d_n$) can be determined by the process chemistry, the molecule size, the flow rate, the chamber pressure, the beam size, etc. for the production process recipe.

The skimmer cartridge assembly 35 can include an inner skimmer element 10 that has a frustoconical configuration. The inner skimmer element 10 can extend from a skimmer input aperture 11 of inner diameter ($ds_0$) to an internal wall 34a of the skimmer cartridge assembly 35 where the inner skimmer element 10 has an outer diameter ($dd_0$). The inner diameter ($ds_0$) of the skimmer input aperture 11 can vary from approximately 0.1 mm to approximately 10 mm. The outer diameter ($dd_0$) can vary from approximately 0.5 mm to approximately 50 mm and is greater than the inner diameter ($ds_0$). A length ($l_0$) and an angle ($a_0$) can also be associated with the inner skimmer element 10. The length ($l_0$) from the skimmer input aperture 11 to the internal wall 34a can vary from approximately 20 mm to approximately 40 mm, and the angle ($a_0$) from the internal wall 34a can vary from approximately 100 degrees to approximately 175 degrees. The inner diameter ($ds_0$), the length ($l_0$) and the angle ($a_0$) can be dependent upon the desired width for the external beam 39, the gas cluster size, and the process chemistry (gases) that the nozzle/skimmer module 20 is designed to create. Alternatively, the inner skimmer element 10 may be configured differently.

The nozzle output aperture 31 can be separated from the skimmer input aperture 11 by a separation distance ($s_1$) that can vary from approximately 10 mm to approximately 50 mm. Alternatively, other separation distances ($s_1$) may be used. In use, internal beam 28 (gas jet) is created from the nozzle output aperture 31 of the nozzle assembly 30 and aligned with and directed towards the skimmer input aperture 11 in the skimmer cartridge assembly 35.

The skimmer cartridge assembly 35 can include a first outer shaping element 12 that has a frustoconical configuration. The first outer shaping element 12 can extend from the skimmer input aperture 11 outwardly to a circular opening 13 adjacent to or inside of an external wall 34b of the skimmer cartridge assembly 35. The skimmer input aperture 11 can have an inner diameter ($ds_0$) that can vary from approximately 0.1 mm to approximately 10 mm. The circular opening 13 can have a first diameter ($ds_1$) that can vary from approximately 0.5 mm to approximately 10 mm, and that is greater than the inner diameter ($ds_0$). A first length ($ls_1$) and a first angle ($as_1$) can be associated with the first outer shaping element 12. The first length ($ls_1$) from the skimmer input aperture 11 to circular opening 13 can vary from approximately 20 mm to approximately 40 mm, and the first angle ($as_1$) (measured from a plane parallel with the skimmer input aperture 11 to a surface of the first outer shaping element 12) can vary from approximately 100 degrees to approximately 175 degrees. The first diameter ($ds_1$), the first length ($ls_1$) and the first angle ($as_1$) can be dependent upon the desired width for the external beam 39, the gas cluster size, and the process chemistry (gases) that the nozzle/skimmer module 20 is designed to use. Alternatively, the first outer shaping element 12 may be configured differently.

The skimmer cartridge assembly 35 can include a second outer shaping element 14 that also has a frustoconical configuration. The second outer shaping element 14 can extend from the circular opening 13 outwardly to a circular opening 15 that intersects with the external wall 34b. The first diameter ($ds_1$) of circular opening 13 can vary from approximately 0.5 mm to approximately 10 mm, and a second diameter ($ds_2$) of the circular opening 15 can vary from approximately 1 mm to approximately 20 mm. A second length ($ls_2$) and a second angle ($as_2$) can also be associated with the second outer shaping element 14. The second length ($ls_2$) from the circular opening 13 to the circular opening 15 can vary from approximately 10 mm to approximately 20 mm, and the second angle ($as_2$) (measured from a plane parallel with the circular opening 13 to a surface of the second outer shaping element 14) can vary from approximately 135 degrees to approximately 175 degrees. The second diameter ($ds_2$), the second length ($ls_2$) and the second angle ($as_2$) can be dependent upon the desired width for the external beam 39, the gas cluster size, and the process chemistry (gases) that the nozzle/skimmer module 20 is designed to use. Alternatively, the second outer shaping element 14 may be configured differently. In other embodiments, the first outer shaping element 12 and/or the second outer shaping element 14 may not be required. In addition, the skimmer cartridge assembly 35 can comprise one or more fourth mounting holes 36 that can be configured to removably couple the nozzle/skimmer module 20 to a chamber wall. The external beam 39 of the nozzle/skimmer module 20 can be aligned in the x-direction, the y-direction, and the z-direction before nozzle/skimmer module 20 is mounted to the chamber wall. Alternatively, one or more mechanical positioning devices (not shown) may be used.

The skimmer cartridge assembly 35 can have a first thickness ($ts_1$) that can vary from approximately 20 mm to approximately 40 mm, a second thickness ($ts_2$) that can vary from approximately 10 mm to approximately 20 mm, a third thickness ($ts_3$) that can vary from approximately 10 mm to approximately 20 mm, and a fourth thickness ($ts_4$) that can vary from approximately 10 mm to approximately 20 mm.

The skimmer cartridge assembly 35 can have a third diameter ($ds_3$) that can vary from approximately 30 mm to approximately 50 mm, a fourth diameter ($ds_4$) that can vary from approximately 50 mm to approximately 60 mm, a fifth diameter ($ds_5$) that can vary from approximately 70 mm to approximately 80 mm, and a sixth diameter ($ds_6$) that can vary from approximately 80 mm to approximately 90 mm, a seventh diameter ($ds_7$) that can vary from approximately 85 mm to approximately 95 mm, a eighth diameter ($ds_8$) that can vary from approximately 90 mm to approximately 100 mm.

The second cylindrical subassembly 41 can be removably coupled to the first cylindrical subassembly 40 using three or more third mounting holes 23 and three or more third fastening devices 24 and a first O-ring 42. For example, the first O-ring 42 can be a style 2-111 from Viton, Inc. Alternatively, a different first O-ring 42 may be used. The first cylindrical subassembly 40 can have a first thickness ($t_1$) that can vary from approximately 2 mm to approximately 5 mm and a first diameter ($d_1$) that can vary from approximately 75 mm to approximately 95 mm. Alternatively, the first cylindrical subassembly 40 may be configured differently. The second cylindrical subassembly 41 can have a second thickness ($t_2$) that can vary from approximately 2 mm to approximately 5 mm and a second diameter ($d_2$) that can vary from approximately 45 mm to approximately 75 mm. Alternatively, the second cylindrical subassembly 41 may be configured differently.

In some embodiments, a cylindrical mixing space 43 can be configured by removing material from the first cylindrical subassembly 40 and/or from the second cylindrical subassembly 41. In addition, one or more second O-rings 44 can be provided between the first cylindrical subassembly 40 and the second cylindrical subassembly 41. For example, the second O-rings 44 can be style 2-010 O-rings from Viton, Inc. Alternatively, a different second O-ring 44 may be used. In addition, a point of use filter may be incorporated in the cylindrical mixing space 43 to preclude particles from obstructing the orifice of nozzle assembly 30. The cylindrical mixing space 43 can have a third thickness ($t_3$) that can vary from approximately 2 mm to approximately 5 mm and a third diameter ($d_3$) that can vary from approximately 15 mm to approximately 25 mm. Alternatively, the cylindrical mixing space 43 may be configured differently. A cylindrical supply element 43a can be coupled to the cylindrical mixing space 43 and can be used to provide process gases to the cylindrical mixing space 43. For example, the cylindrical supply element 43a can be fabricate using tubing material having an inside diameter that can vary from approximately 0.2 mm to 2 mm. In addition, a cylindrical coupling element 43b can be attached to the cylindrical supply element 43a.

In some embodiments, the cylindrical mixing space 43 can be pre-tested when the first cylindrical subassembly 40 is initially coupled to the second cylindrical subassembly 41, and one or more pre-tested cylindrical mixing spaces 43 can be conveniently stored on-site.

In some alignment tests, an optical input signal from an optical test source can be provided through the cylindrical supply element 43a, and an optical output signal can be measured at the second outer shaping element 14 of the skimmer cartridge assembly 35 using an optical receiver. In this manner, the alignment of the internal beam 28 can be optically tested and verified.

The nozzle/skimmer module 20 can include a gas feed tube assembly 45 that can be configured to provide process gas to the cylindrical mixing space 43 at a controlled flow rate. The gas feed tube assembly 45 can include an input gas feed element 45a, a coiled gas feed element 45b, and an output gas feed element 45c. The gas feed tube assembly 45 (45a, 45b, and 45c collectively) can have a fourth length ($l_4$) (from element 45a to element 45c) that can vary from approximately 1000 mm to approximately 1500 mm and an inside diameter ($d_4$) that can vary from approximately 0.5 mm to approximately 2.5 mm. Alternatively, the gas feed tube assembly 45 and/or the coiled gas feed element 45b may be configured differently. When the nozzle/skimmer module 20 is being fabricated, the output gas feed element 45c can be used to attach the gas feed tube assembly 45 to the cylindrical coupling element 43b. In some embodiments, the input gas feed element 45a, the coiled gas feed element 45b, and/or the output gas feed element 45c can be configured to provide process gas to the cylindrical mixing space 43 at a controlled flow rate. For example, one or more of the gas feed elements (45a, 45b, and 45c) can be constructed using metal tubing.

Figure 2:
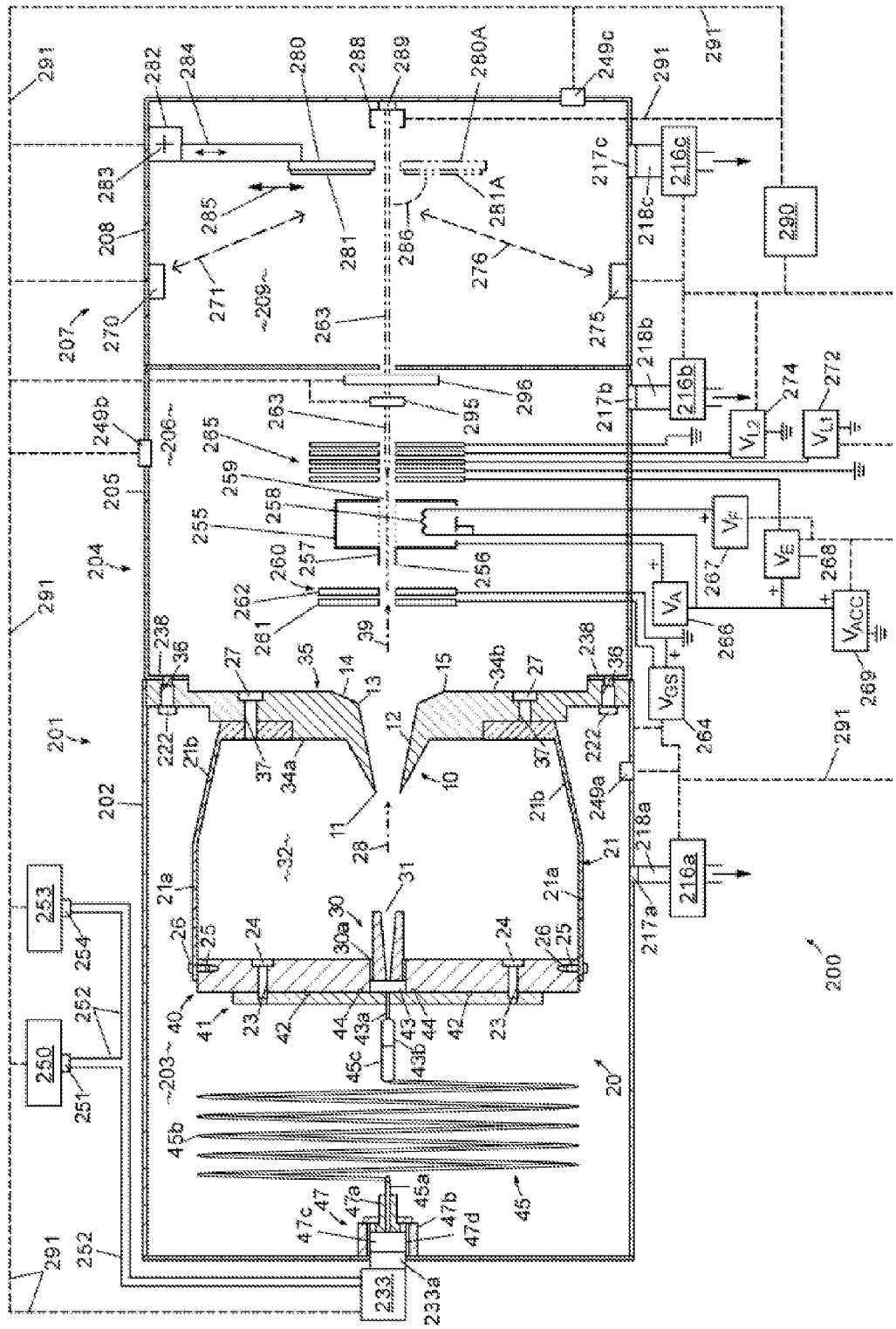
FIG. 2 shows an exemplary configuration for a test GCIB system used for aligning a nozzle/skimmer module and for improved GCIB processing in accordance with embodiments of the invention.

The nozzle/skimmer module 20 can include a gas input supply assembly 47 that can be coupled to the gas feed tube assembly 45. In some embodiments, the gas input supply assembly 47 can include a holding element 47a, an attachment element 47b, and an interior space portion 47c. For example, the holding element 47a can be used to couple the gas input supply assembly 47 to the input gas feed element 45a. In addition, the interior space portion 47c can be coupled to the interior space of the input gas feed element 45a. The gas input supply assembly 47 can be used to removably couple the nozzle/skimmer module 20 to an internal gas supply line when the nozzle/skimmer module 20 is mounted within a low-pressure processing chamber in a GCIB system as shown in FIG. 2. For example, the gas input supply assembly 47 can include a threaded means 47d that can be used for coupling. In various embodiments, the cylindrical mixing space 43, the gas feed tube assembly 45, or the gas input supply assembly 47 can include flow control devices, filters, and valves as required and can be used to control the flow rate of the processing gases into the nozzle assembly 30. For example, the flow rates can vary from approximately 10 sccm to approximately 5000 sccm.

The feed, supply and coupling elements (45a, 45b, 45c, 43a, and 43b) can be both gas tight and non-reactive with the variety of gases used. For example, a double walled woven stainless steel mesh with a Kapton or Gore-Tex inner membrane to allow for flex without high gas permeation can be used.

The nozzle/skimmer module 20 can have an overall length (OL) that can vary from approximately 18 cm to approximately 28 cm.

FIG. 2 shows an exemplary configuration for a GCIB system that can be used for aligning and/or testing a nozzle/skimmer module 20 before it is mounted in a production GCIB processing system in accordance with embodiments of the invention, or that can be used as a production GCIB processing system in which a nozzle/skimmer module 20 is mounted that has been pre-aligned and/or tested. The GCIB system 200 comprises a source subsystem 201, an ionization/acceleration subsystem 204, and a processing subsystem 207. The source subsystem 201 can include a source chamber 202 having an interior space 203, the ionization/acceleration subsystem 204 can include an ionization/acceleration chamber 205 having an interior space 206, and the processing subsystem 207 can include a processing chamber 208 having an interior space 209.

The GCIB system 200 can include a first vacuum pumping system 216a, a second vacuum pumping system 216b, and a third vacuum pumping system 216c. One or more pressure control elements 217a can be coupled into the source chamber 202, and one or more of the pressure control elements 217a can be coupled to the first vacuum pumping system 216a using one or more external vacuum hoses 218a. Also, one or more pressure control elements 217b can be coupled into the ionization/acceleration chamber 205, and one or more of the pressure control elements 217b can be coupled to the second vacuum pumping system 216b using one or more external vacuum hoses 218b. In addition, one or more pressure control elements 217c can be coupled into the processing chamber 208, and one or more of the pressure control elements 217c can be coupled to the third vacuum pumping system 216c using one or more external vacuum hoses 218c.

The source chamber 202, the ionization/acceleration chamber 205, and the processing chamber 208 can be evacuated to suitable testing and/or operating pressures by the first, second and third vacuum pumping systems 216a, 216b, and 216c, respectively, when the nozzle/skimmer module 20 is being aligned and/or tested, or when the pre-aligned nozzle/skimmer module 20 is being used. In addition, the vacuum pumping system 216a can be used to establish the correct pressure in the process space 232 in the pre-aligned nozzle/skimmer module 20 during operation. Vacuum pumping systems 216a, 216b, and 216c can include turbo-molecular vacuum pumps (TMP) capable of pumping speeds up to about 5000 liters per second (and greater) and a gate valve for throttling the chamber pressure. In conventional vacuum processing devices, a 1000 to 2000 liter per second TMP can be employed. TMPs are useful for low pressure processing, typically less than about 50 mTorr.

Furthermore, in some embodiments, a first chamber pressure monitoring device 249a can be coupled to or configured within the source chamber 202, a second chamber pressure monitoring device 249b can be coupled to or configured within the ionization/acceleration chamber 205, and a third chamber pressure monitoring device 249c can be coupled to or configured within the processing chamber 208. Alternatively, a chamber pressure monitoring device may be coupled to the nozzle/skimmer module 20. For example, the pressure-monitoring device can be a capacitance manometer or ionization gauge. Controller 290 can be coupled to the vacuum pumping systems (216a, 216b, and 216c) and to the chamber pressure monitoring devices (249a, 249b, and 249c) through signal bus 291. In addition, the controller 290 can monitor and/or control the vacuum pumping systems (216a, 216b, and 216c) and the chamber pressure monitoring devices (249a, 249b, and 249c) when the nozzle/skimmer module 20 is being aligned and/or tested, or when a correctly operating pre-aligned nozzle/skimmer module 20 is being used.

The nozzle/skimmer module 20, as described above with reference to FIG. 1, can be positioned in the source subsystem 201 of a test system (e.g., system 200) after the nozzle/skimmer module 20 is constructed. After the nozzle/skimmer module 20 is pre-aligned and/or tested, it can then be positioned in the source subsystem 201 of a production processing system (e.g., system 200). The skimmer cartridge assembly 35 can be used to removably couple the nozzle/skimmer module 20 to an interior wall 238 of the source chamber 202 using the plurality of fourth mounting holes 36 and a plurality of fourth fastening devices 222, as shown in FIG. 2. Alternatively, the skimmer cartridge assembly 35 may be used to removably couple the nozzle/skimmer module 20 to an exterior wall of the source chamber 202 (not shown). The skimmer cartridge assembly 35 can be aligned in the x-direction, the y-direction, and the z-direction before it is mounted within the interior space 203 of the source chamber 202. Alternatively, one or more positioning devices (not shown) may be used when mounting the nozzle/skimmer module 20.

As explained above with reference to FIG. 1, the nozzle output aperture 31 can be separated from the skimmer input aperture 11 by a separation distance ($s_1$), which can vary, for example, from approximately 10 mm to approximately 50 mm. The correct separation distance ($s_1$) can be established when the nozzle/skimmer module 20 is tested and/or aligned. When the separation distance ($s_1$) is not correct, the nozzle assembly 30, the support tube 21 and/or the skimmer cartridge assembly 35 can be repositioned or re-manufactured. The separation distance ($s_1$) can be dependent upon the process chemistry (gases) that the nozzle/skimmer module 20 is designed to use in a production process system.

When the nozzle/skimmer module 20 is aligned and/or tested, the skimmer cartridge assembly 35 can be aligned with the nozzle assembly 30 such that the internal beam 28 established from nozzle output aperture 31 is aligned with and directed towards the skimmer input aperture 11 in the skimmer cartridge assembly 35. In some embodiments, the nozzle assembly 30 can be pre-tested and/or pre-aligned before it is coupled to the second cylindrical subassembly 41. Further, one or more pre-tested and/or pre-aligned nozzle assemblies 30 can be configured differently, and the differences can be determined by the process chemistry, the molecule size, the flow rate, the chamber pressure, the cluster size, the beam size, etc. In addition, one or more pre-tested and/or pre-aligned nozzle assemblies 30 can be stored on-site to facilitate the use of other process recipes.

When the internal beam 28 is aligned correctly, the first portion 21a of the support tube 21 can be rigidly and removably coupled to the first cylindrical subassembly 40 using two or more first mounting holes 25 and two or more first fastening devices 26, and the second portion 21b of the support tube 21 can be rigidly and removably coupled to the skimmer cartridge assembly 35 using the second mounting holes 37 and second fastening devices 27 to maintain the correct alignment.

In some embodiments, as discussed above, the cylindrical mixing space 43 can be pre-tested when the first cylindrical subassembly 40 is initially coupled to the second cylindrical subassembly 41, and one or more pre-tested cylindrical mixing spaces 43 can be conveniently stored on-site. For example, during alignment and/or testing of the cylindrical mixing space 43, one or more controlled test gas sources can provide one or more test gases at one or more different flow rates to the cylindrical mixing space 43 through the cylindrical supply element 43a and the cylindrical coupling element 43b.

As discussed above, the nozzle/skimmer module 20 can include a gas feed tube assembly 45 that can be configured to provide process gas to the cylindrical mixing space 43 at a controlled flow rate. A gas input supply assembly 47 can be coupled to the gas feed tube assembly 45. In some embodiments, the gas input supply assembly 47 can be used to removably couple the nozzle/skimmer module 20 to a gas output port 233a attached to a gas supply subassembly 233. For example, threaded means 47d can be used to attach the attachment element 47b to the gas output port 233a. Alternatively, a "snap-connect" means can be used to attach the attachment element 47b to the gas output port 233a. In addition, the interior space portion 47c can be coupled to the interior space of the gas output port 233a. In addition, the gas output port 233a can be attached to the wall of the source chamber 202.

In various embodiments, the gas supply subassembly 233 and/or the gas output port 233a can include flow control devices, filters, and valves as required. The gas supply subassembly 233 and/or the gas output port 233a can be used to control the flow rate of the processing gases into the nozzle/skimmer module 20. For example, the flow rates can vary from approximately 10 sccm to approximately 3000 sccm.

When the nozzle/skimmer module 20 is aligned and/or tested, the nozzle/skimmer module 20 can produce a test external beam 39 that can be directed into the interior space 206 in the ionization/acceleration chamber 205. The pre-aligned nozzle/skimmer module 20 can then be configured in a production process GCIB system 200 that can provide improved GCIB processes for a workpiece 281, which may be a semiconductor wafer, a thin film on a substrate, or other workpiece that requires improved GCIB processing. When the pre-aligned nozzle/skimmer module 20 is used in the GCIB system 200, the pre-aligned nozzle/skimmer module 20 can produce a pre-aligned external beam 39 that can be directed into the interior space 206 in the ionization/acceleration chamber 205 to process the workpiece 281.

Some GCIB systems 200 can include a first gas supply subsystem 250, and a second gas supply subsystem 253. For example, the first gas supply subsystem 250 can be coupled to the gas supply subassembly 233 using one or more of the external gas supply lines 252 and one or more first flow control elements 251, and the second gas supply subsystem 253 can be coupled to the gas supply subassembly 233 using one or more of the external gas supply lines 252 and one or more second flow control elements 254. A first gas composition stored in the first gas supply subsystem 250 and/or a second gas composition stored in the second gas supply subsystem 253 can be used when the nozzle/skimmer module 20 is being aligned and/or tested or when it is being used in a production process.

In some examples, the nozzle/skimmer module 20 can be configured to use a first gas composition, and the first gas composition can include a condensable inert gas that can include a noble gas, i.e., He, Ne, Ar, Kr, Xe, or Rn. In other examples, the nozzle/skimmer module 20 can be configured to use a second gas composition that can comprise a film forming gas composition, an etching gas composition, a cleaning gas composition, a smoothing gas composition, etc. Furthermore, the first gas supply subsystem 250 and the second gas supply subsystem 253 may be utilized either alone or in combination with one another when the nozzle/skimmer module 20 is configured to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any combination of two or more thereof.

During alignment, testing, and/or GCIB processing, the first gas composition and/or the second gas composition may be provided to the nozzle/skimmer module 20 at a high pressure to produce ionized clusters comprising helium, neon, argon, krypton, xenon, nitrogen, oxygen, hydrogen, methane, nitrogen trifluoride, carbon dioxide, sulfur hexafluoride, nitric oxide, or nitrous oxide, or any combination of two or more thereof. For example, the first gas composition and/or the second gas composition can be introduced into the cylindrical mixing space 43 and can be ejected into the substantially lower pressure vacuum in the partially-open process space 32 inside the support tube 21 through the nozzle assembly 30. When the high-pressure condensable gas from the nozzle assembly 30 expands into the lower pressure region of the partially-open process space 32, the gas molecule velocities can approach supersonic speeds and an internal beam 28 (gas jet) is created between the nozzle output aperture 31 of the nozzle assembly 30 and the skimmer input aperture 11 of the inner skimmer element 10, and an external beam 39 of clusters can emanate from the first outer shaping element 12 and the second outer shaping element 14 in the nozzle/skimmer module 20.

The flow elements in gas feed tube assembly 45, gas input supply assembly 47, and cylindrical supply and coupling elements 43a, 43b can be both gas tight and non-reactive with the variety of gases used. For example, a double walled woven stainless steel mesh with a Kapton or Gore-Tex inner membrane to allow for flex without high gas permeation can be used.

The source chamber 202 can be a closed structure that is configured to sustain a low pressure therein. One or more of the walls of the source chamber 202 can include a non-reactive metal, such as stainless steel or coated aluminum.

The source subsystem 201 can include one or more pressure control elements 217a coupled into the source chamber 202. One or more of the pressure control elements 217a can be coupled to the first vacuum pumping system 216a using one or more external vacuum hoses 218a. In alternate embodiments, one or more internal vacuum hoses (not shown) may be coupled to the support tube 21 and may be used to control the pressure in the interior partially-open process space 32 of the support tube 21.

A supersonic gas jet is generated as an internal beam 28 in the nozzle/skimmer module 20. Cooling, which results from the expansion in the jet, causes a portion of the supersonic gas jet to condense into clusters, each consisting of from several to several thousand weakly bound atoms or molecules. The skimmer cartridge assembly 35 in the nozzle/skimmer module 20 partially separates the gas molecules that have not condensed into a cluster jet from the cluster jet so as to minimize pressure in the downstream regions where such higher pressures would be detrimental (e.g., ionizer 255, high voltage electrodes 265, and processing chamber 208). Suitable condensable processing gases can include, but are not necessarily limited to argon, nitrogen, carbon dioxide, oxygen, and other gases. The skimmer input aperture 11, the first outer shaping element 12, and the second outer shaping element 14 are preferably conical and form an external beam 39 that is substantially cylindrical.

During some alignment and/or testing procedures or processing procedures, the external beam 39 from the nozzle/skimmer module 20 can contain gas clusters, and the external beam 39 of clusters can be sent through an electron suppressor apparatus 260. Alternatively, an electron suppressor apparatus 260 may not be required or may be used at a different location during some alignment, testing, and/or processing procedures. The electron suppressor apparatus 260 can comprise an electrically conductive electron suppressor electrode 261 at a first potential, a secondary electrode 262 at a second potential, and a suppressor electrode bias power supply 264. Suppressor electrode bias power supply 264 provides a glitch suppression voltage $V_{GS}$ and the $V_{GS}$ test range can vary from about 1 kV to about 5 kV. The electron suppressor electrode 261 can be negatively biased with respect to secondary electrode 262 and the nozzle/skimmer module 20, and the secondary electrode 262 and nozzle/skimmer module 20 can be at approximately the same potential during testing and/or processing. Electron suppressor electrode 261 and secondary electrode 262 each have a coaxially-aligned aperture for transmission of the external beam 39 (neutral supersonic gas jet). The negatively biased electron suppressor apparatus 260 provides an electric field in the region between the nozzle/skimmer module 20 output (circular openings 13, 15) and the electron suppressor electrode 261 that causes any secondary electrons ejected from the nozzle/skimmer module 20 output region to follow trajectories that return them toward the output of nozzle/skimmer module 20 or electrically connected adjacent regions and prevents them from being accelerated and producing ionization in the external beam 39 (supersonic gas jet) in the region between nozzle/skimmer module 20 and the ionizer 255. Both the extension tube 257 and electron suppressor apparatus 260 contribute to reduction of beam glitches due to discharges and arcing in the region between the output of the nozzle/skimmer module 20 and the ionizer 255. Used in combination as shown in FIG. 2, they are significantly more effective than the sum of their independent contributions. The combination reduces to a negligible level the skimmer-ionizer discharge as a source of beam glitching and has enabled production of stable GCIB beam currents on the order of 500 to 1000 microamperes with glitch rates from all causes on the order of one per hour. This is an improvement of from 10 times to 100 times over previously obtained results from conventional systems. Alternatively, magnetic electron suppressors and other electron gates may be used.

During some alignment, testing, and/or processing procedures, the supersonic gas clusters in the external beam 39 that exit from the electron suppressor apparatus 260 can be ionized in an ionizer 255, which preferably has a substantially cylindrical geometry coaxially aligned with the supersonic clusters in the external beam 39. The ionizer 255 can be an electron impact ionizer that produces thermoelectrons from one or more ionizer filaments 258 and accelerates and directs the electrons causing them to collide with the supersonic gas clusters in the external beam 39, as the jet (beam) passes through the ionizer 255. The electron impact ejects electrons from the clusters, causing a portion the clusters to become positively ionized. A set of suitably biased high voltage electrodes 265 extracts the cluster ions from the ionizer, forming a beam, then accelerates them to a desired energy (typically from 1 keV to several tens of keV) and focuses them to form a GCIB 263.

During various exemplary tests and processes, a filament power supply 267 can provide filament voltage $V_F$ to heat the ionizer filament 258. An anode power supply 266 can provide anode voltage $V_A$ to accelerate thermoelectrons emitted from the ionizer filament 258 to cause them to irradiate the cluster-containing external beam 39 to produce ions. A test extraction power supply 268 can provide extraction voltage $V_E$ to bias a high voltage electrode to extract ions from the ionizing region of ionizer 255 and to form a GCIB 263. An accelerator power supply 269 can provide acceleration voltage $V_{ACC}$ to bias a high voltage electrode with respect to the ionizer 255 so as to result in a total GCIB acceleration equal to $V_{ACC}$. One or more lens power supplies (272 and 274) can be provided to bias high voltage electrodes with focusing voltages ($V_{L1}$ and $V_{L2}$) to create a GCIB 263 that can be shaped and/or focused.

The GCIB system 200 can include an X-scan controller 282 that provides linear motion of the workpiece holder 280 in the direction of the X-scan motion 283 (into and out of the plane of the paper). A Y-scan controller 284 provides linear motion of the workpiece holder 280 in the direction of Y-scan motion 285, which is typically orthogonal to the X-scan motion 283. During some alignment, testing, and/or processing procedures, the combination of X-scanning and Y-scanning motions can move a workpiece 281, held by the workpiece holder 280, in a raster-like scanning motion through the GCIB 263. When the GCIB system 200 is operating correctly, the GCIB 263 can provide a uniform irradiation of a surface of the workpiece 281 thereby causing a uniform processing of the workpiece 281. A controller 290, which may be a microcomputer based controller connects to the X-scan controller 282 and the Y-scan controller 284 through signal bus 291 and controls the X-scan controller 282 and the Y-scan controller 284 so as to place the workpiece 281 into or out of the GCIB 263 and to scan the workpiece 281 uniformly relative to the GCIB 263 to achieve uniform processing of the workpiece 281 by the GCIB 263.

During some test and/or processing procedures, the workpiece holder 280 can position the workpiece 281 at an angle with respect to the axis of the GCIB 263 so that the GCIB 263 has a beam incidence angle 286 with respect to the surface of the workpiece 281. When the GCIB system 200 is operating correctly, the beam incidence angle 286 may be approximately 90 degrees. During Y-scan testing, the workpiece 281 can be held by workpiece holder 280 and can be moved from the position shown to the alternate position "A" indicated by the designators 281A and 280A respectively. When a scanning procedure is performed correctly, the workpiece 281 can be completely scanned through the GCIB 263, and in the two extreme positions, the workpiece 281 can be moved completely out of the path of the GCIB 263 (over-scanned). In addition, similar scanning and/or over-scanning can be performed in the orthogonal X-scan motion 283 direction (in and out of the plane of the paper). During some test cases, the nozzle/skimmer module 20 can be adjusted and/or re-aligned when the test scanning procedure fails.

The workpiece 281 can be affixed to the workpiece holder 280 using a clamping system (not shown), such as a mechanical clamping system or an electrical clamping system (e.g., an electrostatic clamping system). Furthermore, workpiece holder 280 may include a heating system (not shown) or a cooling system (not shown) that is configured to adjust and/or control the temperature of workpiece holder 280 and workpiece 281.

A beam current sensor 288 can be positioned beyond the workpiece holder 280 in the path of the GCIB 263 and can be used to intercept a sample of the GCIB 263 when the workpiece holder 280 is scanned out of the path of the GCIB 263. The beam current sensor 288 can be a faraday cup or the like, and can be closed except for a beam-entry opening, and can be attached to a wall of the processing chamber 208 using an electrically insulating mount 289. Alternatively, one or more sensing devices may be coupled to the workpiece holder 280.

The GCIB 263 can impact the workpiece 281 at a projected impact region on a surface of the workpiece 281. During X-Y testing and processing, the workpiece holder 280 can position each portion of a surface of the workpiece 281 in the path of GCIB 263 so that every region of the surface of the workpiece 281 can be processed by the GCIB 263. The X-scan and Y-scan controllers 282, 284 can be used to control the position and velocity of workpiece holder 280 in the X-axis and the Y-axis directions. The X-scan and Y-scan controllers 282, 284 can receive control signals from controller 290 through signal bus 291. During various tests and processes, the workpiece holder 280 can be moved in a continuous motion or in a stepwise motion to position different regions of the workpiece 281 within the GCIB 263. In one embodiment, the workpiece holder 280 can be controlled by the controller 290 to scan, with programmable velocity, any portion of the workpiece 281 through the GCIB 263.

In some exemplary test or processing sequences, one or more of the surface of the workpiece holder 280 can be constructed to be electrically conductive and can be connected to a dosimetry processor operated by controller 290. An electrically insulating layer (not shown) of workpiece holder 280 may be used to isolate the workpiece 281 and substrate holding surface from the other portions of the workpiece holder 280. Electrical charge induced in the workpiece 281 by impinging the GCIB 263 may be conducted through the workpiece 281 and the workpiece holder 280 surface, and a signal can be coupled through the workpiece holder 280 to controller 290 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the GCIB 263. In such case, a Faraday cup may be used to assure accurate dosimetry despite the added source of electrical charge. During processing of the workpiece 281, the dose rate can be communicated to the controller 290, and the controller 290 can confirm that the GCIB beam flux is correct or to detect variations in the GCIB beam flux.

Controller 290 can also receive the sampled beam current collected by the beam current sensor 288 via signal bus 291. The controller 290 can monitor the position of the GCIB 263, can control the GCIB dose received by the workpiece 281, and can remove the workpiece 281 from the GCIB 263 when a predetermined desired dose has been delivered to the workpiece 281. Alternatively, an internal controller may be used.

The GCIB system 200 as shown in FIG. 2 includes mechanisms permitting increased GCIB currents while reducing or minimizing "glitches." A tubular conductor, such as, for example, extension tube 257, is shown as an integral part of the ionizer 255 disposed at the entrance aperture 256 of the ionizer 255; however, the extension tube 257 need not be so integrally connected. The extension tube 257 is electrically conductive and electrically attached to the ionizer 255 and is thus at the ionizer potential. Other configurations, which achieve approximately the same potential relationship between the extension tube 257 and the ionizer 255, may be employed. The ionizer entrance aperture 256 diameter can vary from approximately 2 cm to approximately 4 cm. Extension tube 257 has an inner diameter that can vary from approximately 2 cm to approximately 4 cm. The length of the extension tube 257 can vary from approximately 2 cm to approximately 8 cm. The walls of extension tube 257 are electrically conductive, preferably metallic, and may be perforated or configured as a plurality of connected, coaxial rings or made of screen material to improve gas conductance. Extension tube 257 shields the interior of the ionizer 255 from external electric fields, reducing the likelihood that a positive ion formed near the entrance aperture 256 of the ionizer 255 will be extracted backwards out of the ionizer 255 and accelerated toward the output end of the nozzle/skimmer module 20. The ionizer exit aperture 259 diameter can vary from approximately 2 cm to approximately 4 cm.

The GCIB system 200 may further include an in-situ metrology system. For example, the in-situ metrology system may include an optical diagnostic system having an optical transmitter 270 and optical receiver 275 configured to illuminate the workpiece 281 with an incident optical signal 271 and to receive a scattered optical signal 276 from the workpiece 281, respectively. The optical diagnostic system comprises optical windows to permit the passage of the incident optical signal 271 and the scattered optical signal 276 into and out of the processing chamber 208. Furthermore, the optical transmitter 270 and the optical receiver 275 may comprise transmitting and receiving optics, respectively. The optical transmitter 270 can be coupled to and communicate with the controller 290. The optical receiver 275 returns measurement signals to the controller 290. For example, the in-situ metrology system may be configured to monitor the progress of the GCIB processing.

Controller 290 comprises one or more microprocessors, memory, and I/O ports capable of generating control voltages sufficient to communicate and activate inputs to the GCIB system 200 as well as monitor outputs from the GCIB system 200. Moreover, controller 290 can be coupled to and can exchange information with vacuum pumping systems 216a, 216b, and 216c, first gas supply subsystem 250, second gas supply subsystem 253, nozzle/skimmer module 20, gas supply subassembly 233, suppressor electrode bias power supply 264, anode power supply 266, filament power supply 267, extraction power supply 268, accelerator power supply 269, lens power supplies 272 and 274, the optical transmitter 270, the optical receiver 275, X-scan and Y-scan controllers 282 and 284, and beam current sensor 288. For example, a program stored in the memory can be utilized to activate the inputs to the aforementioned components of the GCIB system 200 according to a process recipe in order to perform a test or production GCIB process on a workpiece 281.

In some test embodiments, a beam filter 295 can be positioned in the ionization/acceleration chamber 205 and can be used to eliminate monomers or monomers and light ionized clusters from the GCIB 263 to further define the GCIB 263 before it enters the processing chamber 208. In addition, a beam gate 296 can be disposed in the path of GCIB 263 in the ionization/acceleration chamber 205. For example, the beam gate 296 can have an open state in which the GCIB 263 is permitted to pass from the ionization/acceleration chamber 205 to the processing subsystem 207 and a closed state in which the GCIB 263 is blocked from entering the processing subsystem 207. The controller 290 can be coupled to the beam filter 295 and the beam gate 296, and the controller 290 can monitor and control the beam filter 295 and the beam gate 296 during testing or processing.

Alternatively, an adjustable aperture may be incorporated with the beam filter 295 or included as a separate device (not shown), to throttle or variably block a portion of a GCIB flux thereby reducing the GCIB beam current to a desired value. The adjustable aperture may be employed alone or with other devices and methods known to one skilled in the art to reduce the GCIB flux to a very small value, including varying the gas flow from a GCIB source supply; modulating the ionizer by either varying a filament voltage $V_F$ or varying an anode voltage $V_A$; or modulating the lens focus by varying lens voltages $V_{L1}$ and/or $V_{L2}$.

During some procedures, when an ionized gas cluster ion impinge on a surface of a workpiece 281, a shallow impact crater can be formed with a width of approximately 20 nm and a depth of approximately 10 nm, but less than approximately 25 nm. When imaged using a nano-scale imaging device such as Atomic Force Microscopy (AFM), the impact craters have an appearance similar to indentations. After impact, the inert species from the gas cluster ion vaporizes, or escapes the surface of the workpiece 281 as a gas and is exhausted from the processing subsystem 207 and processing chamber 208 by the vacuum pumping system 216c.

Figure 3:
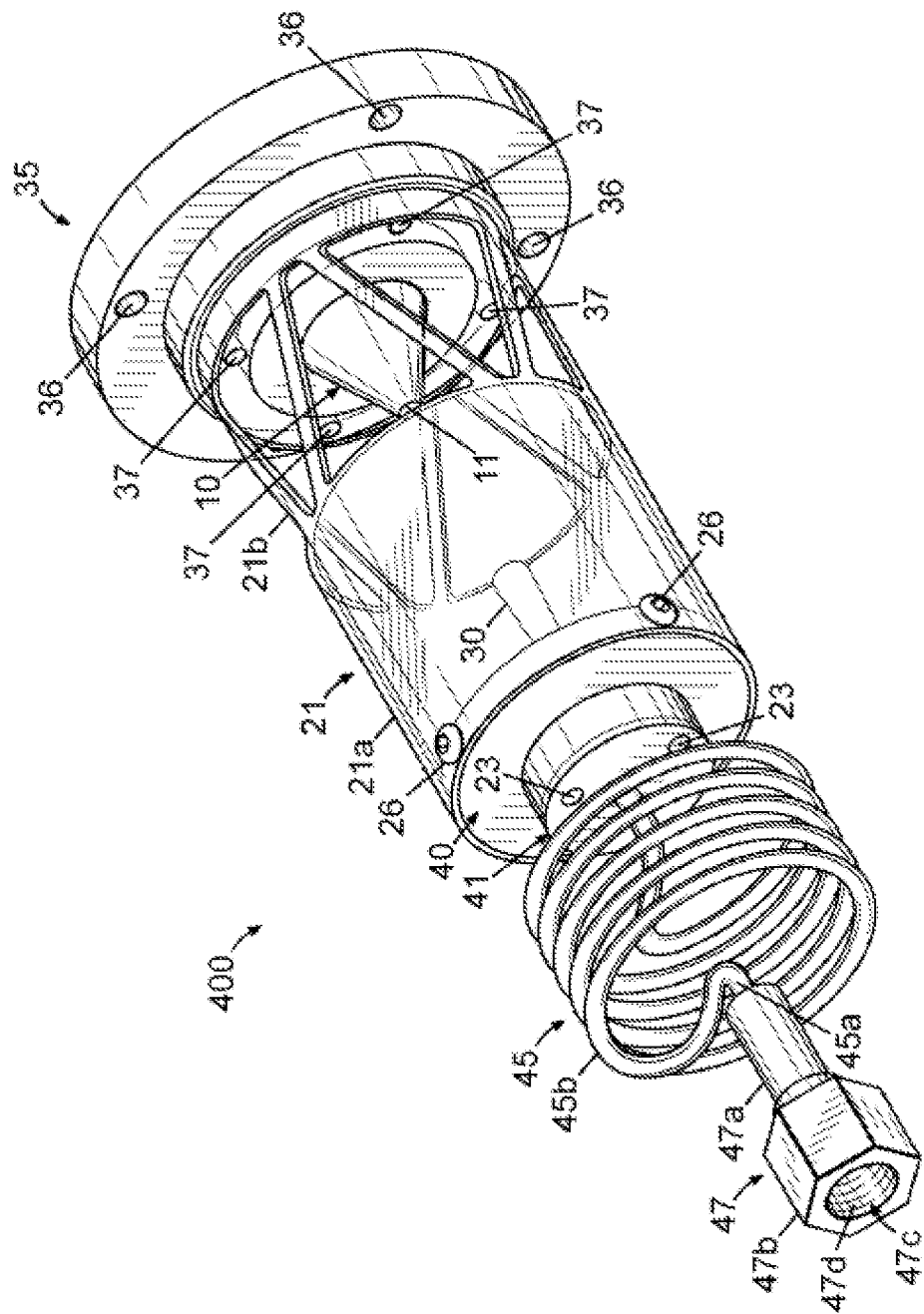
FIG. 3 shows a pictorial view of an exemplary configuration for a nozzle/skimmer module in accordance with embodiments of the invention.

FIG. 3 shows a pictorial view of an exemplary configuration for a nozzle/skimmer module in accordance with embodiments of the invention. In the illustrated embodiment, a nozzle/skimmer module 400 is shown that is similar to nozzle/skimmer module 20 of FIG. 1, having like parts designated by like reference numerals. Alternatively, the nozzle/skimmer module may be configured differently.

Figure 4:
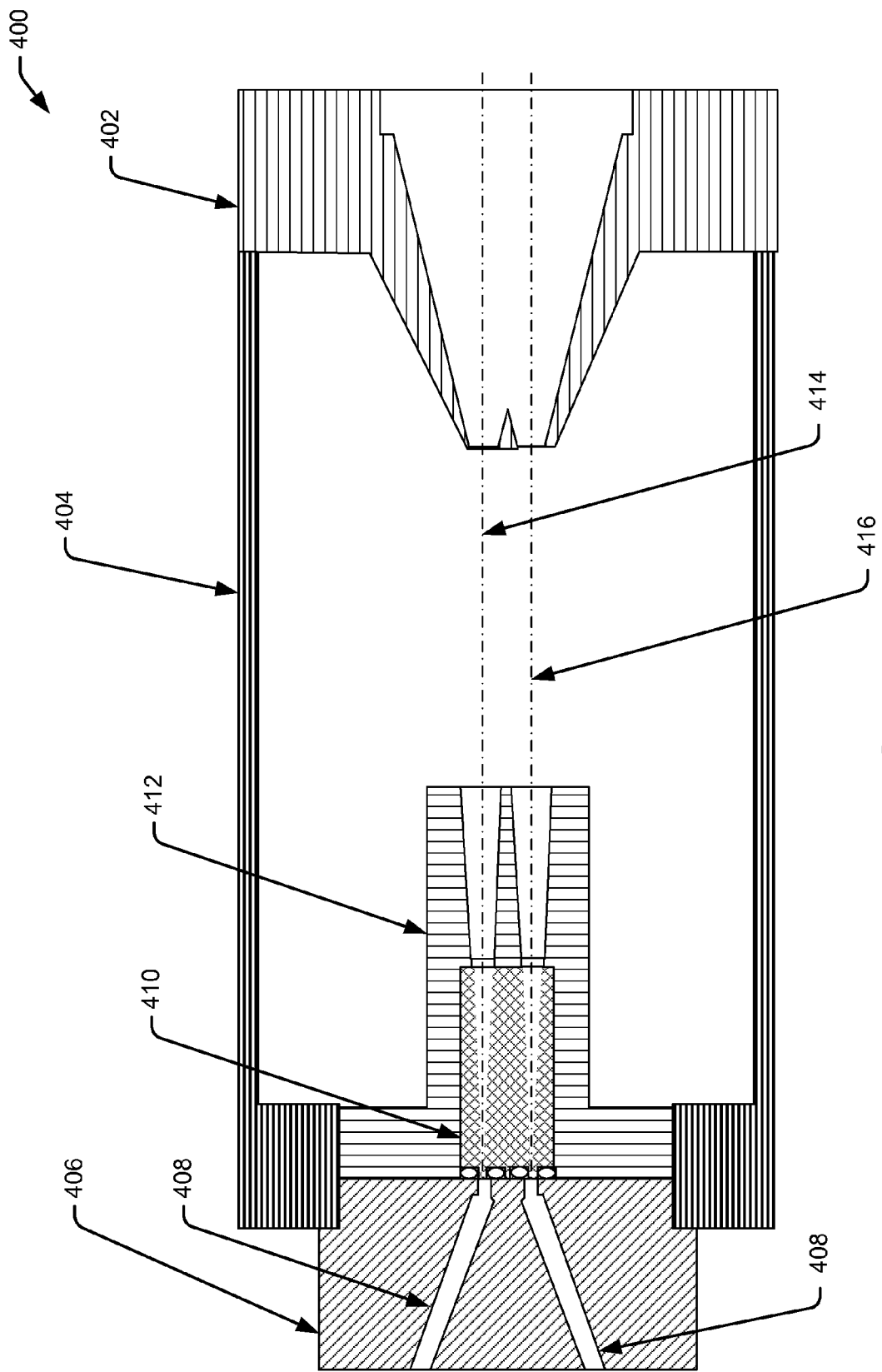
FIG. 4 includes a cross-section illustration of a nozzle assembly for the GCIB processing system.

FIG. 4 includes a cross-section illustration of a nozzle assembly 400 for the GCIB processing system shown in FIG. 2. In contrast to the single beam nozzle shown in FIG. 1, the nozzle assembly 400 may be used to generate two or more GCIBs that may be used to treat the substrate or workpiece 281. Two or more nozzles may be placed adjacent to each other to generate their own corresponding GCIB. Accordingly, a skimmer 402 may be designed to collimate the gas clusters being emitted from the two or more nozzles. The distance between the two or more nozzles and the skimmer may be dictated or controlled by the length of the support tube 404 that is coupled to one or more portions of the nozzle assembly 400. In certain instances, the two or more nozzles may be integrated into a common assembly or piece part or combination of piece parts that may be coupled together. In the FIG. 4 embodiment, the gas manifold 406 may be designed to provide a gas line 408 to each of the nozzles. The gas manifold may enable three or more gases to be introduced to the nozzle assembly. The incoming pressure for the one or more gases may range from 1 atm to 100 atm and have a temperature between −100° C. and 110° C.

In one embodiment, the two or more nozzles may be integrated into combination piece part that may include a first nozzle component 410 that may be adjacent to or aligned with a second nozzle component 412, the details of which will be described in greater detail in the description of FIGS. 5 and 6. However, FIG. 4 does illustrate that the alignment of the conical cavities of the first nozzle component 410 and the second nozzle component 412 such that th conical cavities may be centered along their respective beam centerlines (e.g., beam #1 centerline 414 and beam centerline 416). In this way, each of the nozzle components may contribute to the formation of their respective GCIB based on the alignment of conical cavities that may have the same or substantially similar half angle.

Figure 5:
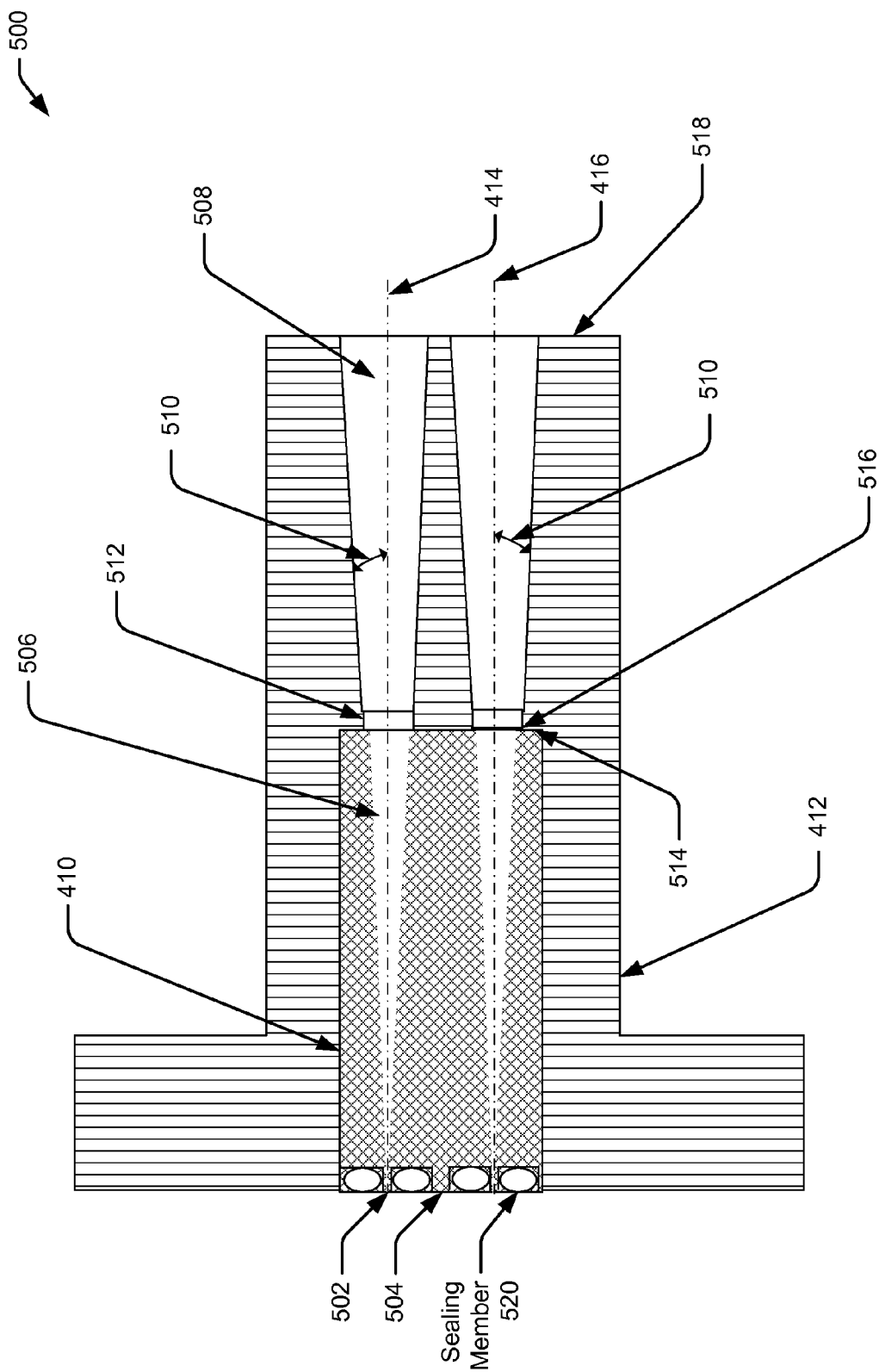
FIG. 5 includes a cross-section illustration of a nozzle component of the nozzle assembly for the GCIB processing system.

FIG. 5 includes a cross-section illustration of a nozzle device 500 that may include the first nozzle component 410 and the second nozzle component 412. The nozzle device 500 may include an orifice 502 through which gas that forms the GCIB may be projected through at a high pressure difference between the gas line 408 and the first conical cavity 506. The diameter of the orifice 502 may vary between 25 µm and 500 µm. In one specific embodiment, the orifice 502 may be about 80 µm. The orifice 502 may be proximate to a first entry surface 504 which may include a substantially flat surface that may be flush with the gas manifold 406. The orifice 502 may have a polished surface or minimal surface roughness that may encourage clustering. The surface roughness may range between 0.1 µm and 0.5 µm with a specific embodiment of about 0.2 µm.

Once through the orifice 502, the gas may be projected through the first conical cavity 506 towards a second conical cavity 508 in the second nozzle component 412. The length of the first conical cavity 506 may range between 20 mm and 60 mm and a length of the second conical cavity 508 may vary based on a ratio of the length of the first conical cavity 506. The ratio may vary from 0.40 to 0.99.

The first conical cavity 506 may also have the same or similar half angle 510 that may be measured from the centerline 414. The half angle 510 may range from about 1.5 to about 30.0 degrees. In this way, the edges of the first conical cavity 506 and the second conical cavity 510 may form a line with the same or similar slope. In one specific embodiment, the half angle may be about 6 degrees.

In the FIG. 5 embodiment, the exit diameter of the first conical cavity 506 at the first exit surface 514 may be less than the entry diameter of the second conical cavity 508. In this way, the largest diameter of the first conical cavity 506 may be less than any diameter in the second conical cavity 508 measured from any point along the centerline 414. For example, the exit diameter may vary from 50% to almost 100% of the entry diameter, such that a step height of no more than 1 mm may exist between the first conical cavity 506 and the second conical cavity 508. In certain embodiments, a flat transition region 512 may be disposed between the first conical cavity 506 and the second conical cavity 508. The flat transition region 512 may include the second entry surface 516 that may be opposite the first exit surface 514 of the first nozzle component 410. The first exit surface 514 may also be referred to as the intermediate exit surface that may be disposed between the first entry surface 504 and the second exit surface 518 of the second nozzle component 412.

In one embodiment, the second nozzle component 412 may be called a re-entrant cavity component. In this embodiment, the second nozzle component 412 may include a cavity that houses the first nozzle component 410, such that the first nozzle component 410 may be secured or held in position by the second nozzle component 410. The first nozzle component 410 may slide in to the re-entrant cavity from the first entry surface 504. The re-entrant cavity, in conjunction with the first nozzle component 410, may be designed to align the first conical cavity 506 and the second conical cavity 508 of the re-entrant cavity component.

In the FIG. 5 embodiment, the first nozzle component 410 may be designed to house or accommodate sealing members 520 that maintain a fluidic seal between the gas line 408, the gas manifold 406 and the first nozzle component 410. In this instance, the sealing member 520 may maintain a high pressure differential between the gas line 410 and the first conical cavity 506. The sealing member 520 may include, but is not limited to a sealer, an O-ring, or an elastomer.

In one embodiment, the first nozzle component 410 may be made of a ceramic material and the second nozzle component 412 may be made of metal, such as stainless steel. In one specific embodiment, the ceramic material may be a monolithic piece that may be integrated into the second nozzle component 412.

In another embodiment, the nozzle assembly may include a gas supply manifold having at least one gas supply conduit (e.g., gas line 408) that may be in fluid communication with a first nozzle component 410 of the nozzle assembly. The first nozzle component may include a first portion of at least one conical nozzle (e.g., first conical cavity 506) is formed that extends from a nozzle throat (e.g, orifice 502) at a first entry surface 504 to an intermediate exit at a first exit surface 514. A second nozzle component 412 of the nozzle assembly may be adjacent to the first nozzle component 410. The second nozzle component 412 may include at least one conical nozzle (e.g., second conical cavity 508) that extends from an intermediate inlet at a second entry surface 516 to a nozzle exit at a second exit surface 518. The second nozzle component 412 further including a re-entrant cavity into which the first nozzle component 410 may be inserted, such that the first exit surface 514 interfaces with or touches the second entry surface 516. The re-entrant cavity may be designed to align the first conical cavity with the second conical cavity 508 to enable the desired transition of the GCIB between the two components, such that a centerline of said first nozzle portion coincides or aligns with a centerline of said second nozzle portion.

In one embodiment, a diameter of said intermediate exit at said first exit surface of said first nozzle component may be equal to or less than a diameter of said intermediate inlet at said second entry surface of said second nozzle component.

In another embodiment, the diameter of said intermediate exit of said first nozzle component ranges from about 50% to about 100% of the diameter of said intermediate inlet of said second nozzle component.

The nozzle assembly may also include a sealing member 520 disposed between said first nozzle component 410 and the gas supply manifold 406 such that when the second nozzle component 411 is attached or joined to the gas supply manifold 406 the first entry surface 504 may create a seal (e.g., fluid flow barrier) surrounding an outlet of at least one gas supply conduit 406. In one embodiment, the sealing member may include a sealer, an O-ring, or an elastomer that forms or enables the seal or fluid flow barrier.

In another embodiment, the nozzle assembly may include a pair of nozzles arranged parallel to and adjacent with one another as shown in FIG. 5.

FIG. 6 includes a cross-section illustration 600 of a transition region (e.g., flat transition region T) between two nozzles (e.g., first nozzle component 410, second nozzle component 412) in the nozzle device 500 for the GCIB processing system. In one embodiment, the flat transition region 512 or continuation nozzle may be cylindrical in shape, such that the diameter of the flat transition region 512 may be constant or substantially constant along a distance 604 that may be less than 5 mm. In this embodiment, the diameter of the flat transition region 512 may be larger than the diameter of any portion of the first conical cavity 410 at the first exist surface 516. In this instance, a step height 602 between the first conical cavity 410 and the flat transition region 512 may exist. In one embodiment, the transition region 512 may be no more than 10 mm in length. The step height 602 may be less than 1 mm. In one specific embodiment, the step height 602 may be about 0.04 mm.

An apparatus and method for incorporating a nozzle/skimmer module into a GCIB system is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations may have been described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A nozzle assembly for use in a gas cluster beam (GCB) processing system, comprising:
    a gas supply manifold having at least one gas supply conduit;
    a first nozzle component through which a first portion of at least one conical nozzle is formed that extends from a nozzle throat at a first entry surface to an intermediate exit at a first exit surface;
    a second nozzle component through which a second portion of said at least one conical nozzle extends from an intermediate inlet at a second entry surface to a nozzle exit at a second exit surface, said second nozzle component further including a re-entrant cavity into which said first nozzle component inserts such that said first exit surface mates with said second entry surface, and said first nozzle portion aligns with said second nozzle portion to form said conical nozzle; and
    a sealing member disposed between said first nozzle component and said gas supply manifold such that when said second nozzle component is attached to said gas supply manifold, said first entry surface of said first nozzle component presses against said sealing member and creates a seal with said gas supply manifold surrounding an outlet of said at least one gas supply conduit.

2. The assembly of claim 1, wherein said first nozzle component is a monolithic piece composed of ceramic.

3. The assembly of claim 1, wherein said second nozzle component is composed of stainless steel.

4. The assembly of claim 1, wherein said at least one conical nozzle comprises a pair of nozzles arranged parallel to and adjacent with one another.

5. The assembly of claim 1, wherein a centerline of said first nozzle portion coincides with a centerline of said second nozzle portion.

6. The assembly of claim 1, wherein a diameter of said intermediate exit at said first exit surface of said first nozzle component is equal to or less than a diameter of said intermediate inlet at said second entry surface of said second nozzle component.

7. The assembly of claim 1, wherein a diameter of said intermediate exit at said first exit surface of said first nozzle component is less than a diameter of said intermediate inlet at said second entry surface of said second nozzle component.

8. The assembly of claim 7, where the diameter of said intermediate exit of said first nozzle component ranges from about 50% to about 100% of the diameter of said intermediate inlet of said second nozzle component.

9. A nozzle assembly for use in a gas cluster beam (GCB) processing system, comprising:
    a nozzle component comprising:
        at least one conical nozzle; and
        a nozzle throat disposed proximate to one end of said at least one conical nozzle that can receive gas from a gas supply conduit;
    a re-entrant cavity component comprising:
        a cavity that houses said nozzle component;
        a first opening of said cavity that can receive said nozzle component or said gas;
        a second opening of said cavity that is opposite said first opening and that can receive said gas from said at least one conical nozzle; and
        a continuation nozzle comprising a conical cavity that is aligned with said at least one conical nozzle and can receive said gas from said at least one conical nozzle via said second opening, the conical cavity comprising an entrance diameter that is larger than any diameter of said at least one conical nozzle.

10. The assembly of claim 9, wherein said re-entrant cavity further comprises a transition cavity disposed between said second opening and said continuation nozzle, said transition cavity comprises:
 a substantially cylindrical shape comprising an offset length that said gas flows through from said second opening to said continuation nozzle;
 a diameter that is greater than any diameter along said at least one conical nozzle.

11. The device of claim 10, wherein the diameter of the transition cavity comprises a difference of no more than 1 mm than a diameter of one end of said at least one conical nozzle that is adjacent to the transition cavity.

12. The device of claim 11, wherein the offset length comprises a distance of no more than 10 mm.

13. The assembly of claim 9, further comprising a sealing member disposed between said nozzle component and said gas supply conduit.

14. The assembly of claim 9, wherein said at least one conical nozzle comprises a pair of nozzles arranged parallel to and adjacent with one another.

15. The assembly of claim 14, wherein said re-entrant cavity comprises a third opening of said cavity that is adjacent to the second opening and aligned with one of the pair of nozzles.

16. The assembly of claim 9, wherein said at least one conical nozzle is characterized by a half angle ranging from about 1.5 to about 30.0 degrees.

17. The assembly of claim 9, wherein the ratio of a length of said nozzle component length to total length of said conical nozzle and said continuation nozzle is in a range from 0.40 to 0.99.

18. The assembly of claim 9, wherein the nozzle throat is in a range from 25 µm to 500 µm.

19. The assembly of claim 9, wherein two or more nozzles are configured to generate a target GCB current.

20. The assembly of claim 9, wherein said at least one conical nozzle and said continuation nozzle comprise a total length ranging from about 20 mm to about 60 mm.

* * * * *